(12) United States Patent
Yang et al.

(10) Patent No.: US 9,537,068 B2
(45) Date of Patent: Jan. 3, 2017

(54) LIGHT EMITTING DEVICE PACKAGE

(71) Applicant: SAMSUNG ELECTRONICS CO., LTD., Suwon-si, Gyeonggi-do (KR)

(72) Inventors: Hyun-kwan Yang, Hwaseong-si (KR); Jin-mo Kim, Suwon-si (KR); Kyu-jin Lee, Gwangmyeong-si (KR); Hyung-jin An, Suwon-si (KR)

(73) Assignee: SAMSUNG ELECTRONICS CO., LTD., Samsung-ro, Yeongtong-gu, Suwon-si, Gyeonggi-do (KR)

( * ) Notice: Subject to any disclaimer, the term of this patent is extended or adjusted under 35 U.S.C. 154(b) by 407 days.

(21) Appl. No.: 14/135,078

(22) Filed: Dec. 19, 2013

(65) Prior Publication Data

US 2014/0203728 A1 Jul. 24, 2014

(30) Foreign Application Priority Data

Jan. 23, 2013 (KR) ................ 10-2013-0007652

(51) Int. Cl.
| | | |
|---|---|---|
| *G05F 1/00* | (2006.01) | |
| *H05B 37/02* | (2006.01) | |
| *H05B 39/04* | (2006.01) | |
| *H05B 41/36* | (2006.01) | |
| *H01L 33/60* | (2010.01) | |
| *H05B 33/08* | (2006.01) | |

(52) U.S. Cl.
CPC ........ *H01L 33/60* (2013.01); *H05B 33/0866* (2013.01); *H01L 2224/13* (2013.01); *H01L 2224/48091* (2013.01); *H01L 2924/12044* (2013.01)

(58) Field of Classification Search
USPC .................................. 315/291–311
See application file for complete search history.

(56) References Cited

U.S. PATENT DOCUMENTS

| | | | |
|---|---|---|---|
| 2006/0249175 A1 | 11/2006 | Nowak et al. | |
| 2011/0242818 A1 | 10/2011 | Arita et al. | |
| 2011/0266570 A1* | 11/2011 | Hsieh | H01L 33/486 257/98 |
| 2013/0020590 A1* | 1/2013 | Lin | H01L 33/60 257/88 |
| 2013/0207142 A1* | 8/2013 | Reiherzer | H01L 33/507 257/98 |
| 2015/0014725 A1* | 1/2015 | Hong | C09K 11/7721 257/98 |

FOREIGN PATENT DOCUMENTS

| | | |
|---|---|---|
| EP | 1808904 A1 | 7/2007 |
| JP | 8-264840 A | 10/1996 |
| JP | 2009-224536 A | 10/2009 |
| KR | 2007-0039728 A | 4/2007 |

* cited by examiner

*Primary Examiner* — Brandon S Cole
(74) *Attorney, Agent, or Firm* — Muir Patent Law, PLLC

(57) ABSTRACT

A light emitting device package includes a substrate, a light emitting device disposed on the substrate, a reflector surrounding the light emitting device, and an encapsulant encapsulating the light emitting device. The reflector includes a silicon-based polymer which is a main body portion, and a silicon oxide layer disposed at least on a portion of a surface of the silicon-based polymer.

17 Claims, 10 Drawing Sheets

LIGHT EMITTING DEVICE PACKAGE

CROSS-REFERENCE TO RELATED APPLICATIONS

This application claims benefit of the priority to Korean Patent Application No. 10-2013-0007652, filed on Jan. 23, 2013, in the Korean Intellectual Property Office, the entire contents of which are hereby incorporated by reference.

TECHNICAL FIELD

The present inventive concept relates to a light emitting device package, and more particularly, to a light emitting device package having sufficient hardness, improved light-extraction efficiency, and dimensional stability so as to facilitate stable performance.

BACKGROUND

A light emitting device such as a light emitting diode (LED) is a semiconductor light emitting device that converts an electrical signal into light via a PN junction of a compound semiconductor. As the LED usage has increased in various fields such as indoor and outdoor lighting, headlights of a vehicle, and a backlight unit (BLU) of a display device, development of an LED having reliability and stability is required.

While silicone which is a siloxane-based polymer is widely used as a reflector and an encapsulant in a package of a light emitting diode, hardness of the silicone is still low even after hardening, and a modified silicone having an improved hardness has a low light-extraction efficiency.

SUMMARY

The present inventive concept provides a light emitting device package having sufficient hardness, improved light-extraction efficiency, and dimensional stability so as to facilitate stable performance.

An aspect of the present inventive concept encompasses a light emitting device package including a substrate, a light emitting device disposed on the substrate, a reflector surrounding the light emitting device; and an encapsulant encapsulating the light emitting device. The reflector includes a silicon-based polymer which is a main body portion, and a silicon oxide layer disposed at least on a portion of a surface of the silicon-based polymer.

The silicon oxide layer may be disposed on at least a portion of a surface of the reflector exposed to outside. The silicon oxide layer and the main body portion may be integrally formed as a single unit. The silicon oxide layer may be disposed on at least a portion of the surface of the reflector contacting the encapsulant.

A hydroxyl group (—OH) may be included in at least a portion of the silicon oxide layer. The silicon oxide layer may have a hydrophilicity greater than a hydrophilicity of silicone. The silicon oxide layer may have a thickness of about 0.1 μm to about 100 μm.

A reflective metal layer may be disposed at least on a portion of the substrate exposed through the reflector. The reflective metal layer may be covered by another silicon oxide layer. Also, another silicon-based polymer may be interposed between the reflective metal layer and the silicon oxide layer. Also, a hydroxyl group (—OH) may be disposed adjacent to an interface between the another silicon oxide layer and the another silicon-based polymer.

A particular silicon oxide layer may be formed at least on a portion of a surface of the encapsulant exposed to outside.

Another aspect of the present inventive concept relates to a light emitting device package including a substrate, a light emitting device disposed on the substrate, a reflector surrounding the light emitting device, and an encapsulant encapsulating the light emitting device. At least a portion of the substrate exposed through the reflector is covered by a silicon oxide layer.

A reflective metal layer may be formed at least on a portion of the substrate exposed through the reflector. The reflective metal layer is covered by using the silicon oxide layer. The reflective metal layer may be silver (Ag).

Also, at least a portion of a surface of the encapsulant may include another silicon oxide layer.

Still another aspect of the present inventive concept encompasses a dimming system including a light emitting module including a plurality of light emitting device packages, and a power supply configured to control power supplied to the light emitting module. Each of the light emitting device packages includes a substrate, a light emitting device disposed on the substrate, a reflector surrounding the light emitting device, and an encapsulant encapsulating the light emitting device. The reflector includes a silicon-based polymer which is a main body portion, and a silicon oxide layer disposed at least on a portion of a surface of the silicon-based polymer.

The power supply may include a feedback circuit device configured to compare an emission amount with a previously set light amount in each of the plurality of semiconductor light emitting device packages, and a memory device configured to store information on desired luminance or color rendering.

The silicon oxide layer may be disposed on at least a portion of a surface of the reflector exposed to outside.

The silicon oxide layer and the main body portion may be integrally formed as a single unit.

The silicon oxide layer may be disposed at least a portion of the surface of the reflector contacting the encapsulant.

BRIEF DESCRIPTION OF THE DRAWINGS

The foregoing and other features of the present inventive concept will be apparent from more particular description of embodiments of the present inventive concept, as illustrated in the accompanying drawings in which like reference characters may refer to the same or similar parts throughout the different views. The drawings are not necessarily to scale, emphasis instead being placed upon illustrating the principles of the embodiments of the present inventive concept.

DETAILED DESCRIPTION

Figure 1:
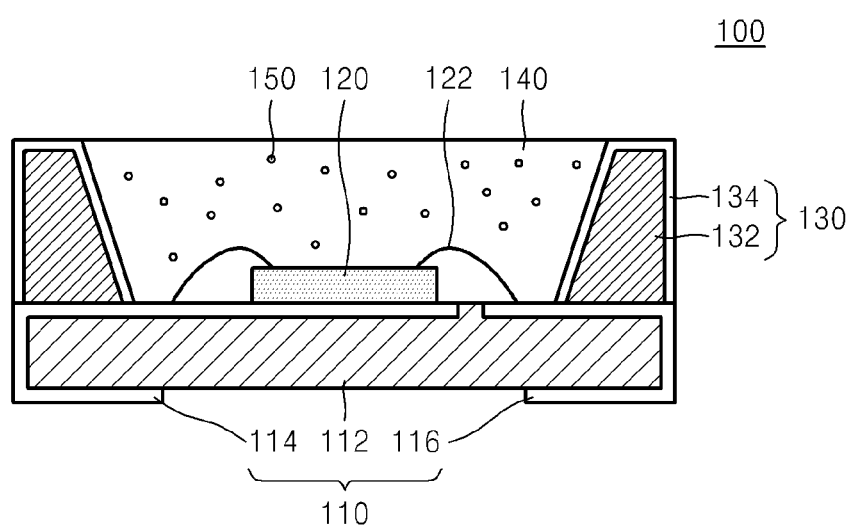
FIG. 1 is a cross-sectional view of a light emitting device package according to an embodiment of the present inventive concept.

Hereinafter, the present inventive concept will be described more fully with reference to the accompanying drawings, in which exemplary embodiments of the present inventive concept are shown. This present inventive concept may, however, be embodied in many different forms and should not be construed as limited to the exemplary embodiments set forth herein. Rather, these embodiments are provided so that this disclosure will be thorough and complete, and will fully convey the scope of the present inventive concept to those of ordinary skill in the art. Like reference numerals refer to like elements throughout. Furthermore, various elements and areas in the drawings are schematically illustrated. Thus, the present inventive concept is not limited by relative sizes or intervals illustrated in the attached drawings.

The terms "first," "second," and the like, and "primary," "secondary," and the like, as used herein do not denote any order, quantity, or importance, but rather are used to distinguish one element, region, component, layer, or section from another. For example, a first element may be referred to as a second element, and similarly, a second element may be referred to as a first element without departing from the scope of protection of the present inventive concept.

The terms used in the present disclosure are merely used to describe particular embodiments, and are not intended to limit the present inventive concept. An expression used in the singular encompasses the expression of the plural, unless it has a clearly different meaning in the context. In the present disclosure, it is to be understood that the terms such as "including" or "having," etc., are intended to indicate the existence of the features, numbers, steps, actions, components, parts, or combinations thereof disclosed in the disclosure, and are not intended to preclude the possibility that one or more other features, numbers, steps, actions, components, parts, or combinations thereof may exist or may be added. Expressions such as "at least one of," when preceding a list of elements, modify the entire list of elements and do not modify the individual elements of the list.

Unless otherwise defined, all terms (including technical and scientific terms) used herein have the same meaning as commonly understood by one of ordinary skill in the art to which the exemplary embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

The present inventive concept provides a light emitting device package including a substrate, a light emitting device mounted on the substrate, a reflector surrounding the light emitting device, and an encapsulant encapsulating the light emitting device. In particular, at least a portion of a surface of the reflector may be formed of a siloxane layer in the form of a network, that is, a silicon oxide ($SiO_x$) layer.

FIG. 1 is a cross-sectional view of a light emitting device package 100 according to an embodiment of the present inventive concept. Referring to FIG. 1, a light emitting device 120 may be mounted on a substrate 110.

The substrate 110 may include an insulator layer 112 and electrode wirings 114 and 116. The insulator layer 112 may be formed of any material having an appropriate mechanical strength and insulating properties. For example, the insulator layer 112 may be formed of bismaleimide-triazine (BT) resin, glass epoxy, or ceramics. Also, the insulator layer 112 may be formed by bonding multiple epoxy-based resin sheets. The electrode wirings 114 and 116 used as a negative electrode and a positive electrode are formed on a surface of the insulator layer 112, in order to electrically connect the insulator layer 112 with the light emitting device 120. The electrode wirings 114 and 116 may be extended over lateral and rear sides of the insulator layer 112 and exposed so that the light emitting device 120 may be electrically connected to an external device. The electrode wirings 114 and 116 may selectively be extended to a rear surface of the insulator layer 112 through a via hole (not separately shown) that passes through the insulator layer 112. The electrode wirings 114 and 116 may be formed of, for example, copper (Cu), nickel (Ni), or silver (Ag), or a combination of these materials. In particular, outermost surfaces of the electrode wirings 114 and 116 may include a reflective metal layer so that light is easily reflected and that light-extraction efficiency is increased. The reflective metal layer may be silver (Ag).

According to some embodiments of the present inventive concept, the light emitting device 120 may be formed of a light emitting diode (LED) chip. The LED chip may emit blue, green or red color light according to types of compound semiconductors, of which the LED chip is formed. Alternatively, the LED chip may emit ultraviolet (UV) rays. According to another embodiment of the present inventive concept, the light emitting device 120 may be formed of a UV light diode chip, a laser diode chip, or an organic light emitting diode (OLED) chip. However, the light emitting device 120 according to the embodiments of the present inventive concept is not limited thereto, and may be formed of other various optical devices.

The light emitting device 120 may be formed of, for example, a semiconductor. For example, the light emitting device 120 may be formed of a nitride semiconductor, which may be represented by a general formula: $Al_xGa_yIn_zN$ ($0 \leq x \leq 1$, $0 \leq y \leq 1$, $0 \leq z \leq 1$, $x+y+z=1$). The light emitting device 120 may be formed by using, for example, a vapor phase growth method such as a metal organic chemical vapor deposition (MOCVD) method, by epitaxially growing a nitride semiconductor such as InN, AlN, InGaN, AlGaN, or InGaAlN on a substrate. Also, besides a nitride semiconductor, the light emitting device 120 may also be formed of a semiconductor such as a ZnO, ZnS, ZnSe, SiC, GaP, GaAlAs, or AlInGaP. As the semiconductor, a stack structure formed by sequentially stacking an n-type semiconductor layer, an emissive layer, and a p-type semiconductor layer may be used. The emissive layer (active layer) may be a stack semiconductor formed of a multiple-quantum-well structure or a single-quantum-well structure or a double-hetero structured stack semiconductor. A light emitting device emitting light of a predetermined wavelength may be selected as the light emitting device 120.

The light emitting device 120 may be attached on the substrate 110 by using a die-bond paste or a silver paste, or using a eutectic bonding method, but the present inventive concept is not limited thereto.

Also, the light emitting device 120 may be electrically connected to the electrode wirings 114 and 116 via a conductive connector 122. The conductive connector 122 may be formed of a material that is selected in consideration of ohmic properties, mechanical connectability, electrical conductivity, and thermal conductive properties between the light emitting device 120 and the electrode wirings 114 and 116. For example, the conductive connector 122 may be formed of a metal alloy bonding wire, a silver alloy bonding wire, a palladium-coated copper bonding wire, or a wire formed of aluminum or platinum. Also, while FIG. 1 illustrates the conductive connector 122 formed of a bonding wire, other electrical connection units such as a ball bump or a stud bump besides a bonding wire may also be used according to types of the light emitting device 120.

The light emitting device package 100 may include a reflector 130 surrounding the light emitting device 120. The reflector 130 may be formed of any material that is capable of reflecting light emitted from the light emitting device 120. Examples of materials of the reflector 130 include a thermosetting resin and a thermoplastic resin. In detail, examples of resins of the reflector 130 include an epoxy resin composition, a silicone resin composition, a modified epoxy resin composition such as a silicon modified epoxy resin, a modified silicone resin composition such as an epoxy modified silicone resin, a polyimide resin composition, a modified polyimide resin composition, a polyphthalamide (PPA), a polycarbonate resin, a polyphenylene sulfide (PPS), a liquid crystal polymer (LCP), an acrylonitrile butadiene styrene (ABS) resin, a phenol resin, an acrylic resin, and a polybutylene terephthalate (PBT) resin. Also, a light-reflective material such as titanium oxide, silicon dioxide, titanium dioxide, zirconium dioxide, potassium titanium oxide, alumina, aluminum nitride, boron nitride, or mullite may be included in the above-described resins.

A silicon oxide ($SiO_x$) layer 134 may be provided at least on a portion of a surface of the reflector 130. The silicon oxide layer may include a silica material in which —Si—O— bonds are included in a network form, and which may include a —Si—OH structure as a terminal or a side chain. A silicon oxide layer has relatively high strength and hardness, and thus, processibility of the silicon oxide layer is excellent, and stability of products formed of the silicon oxide layer may be excellent.

Figure 2:
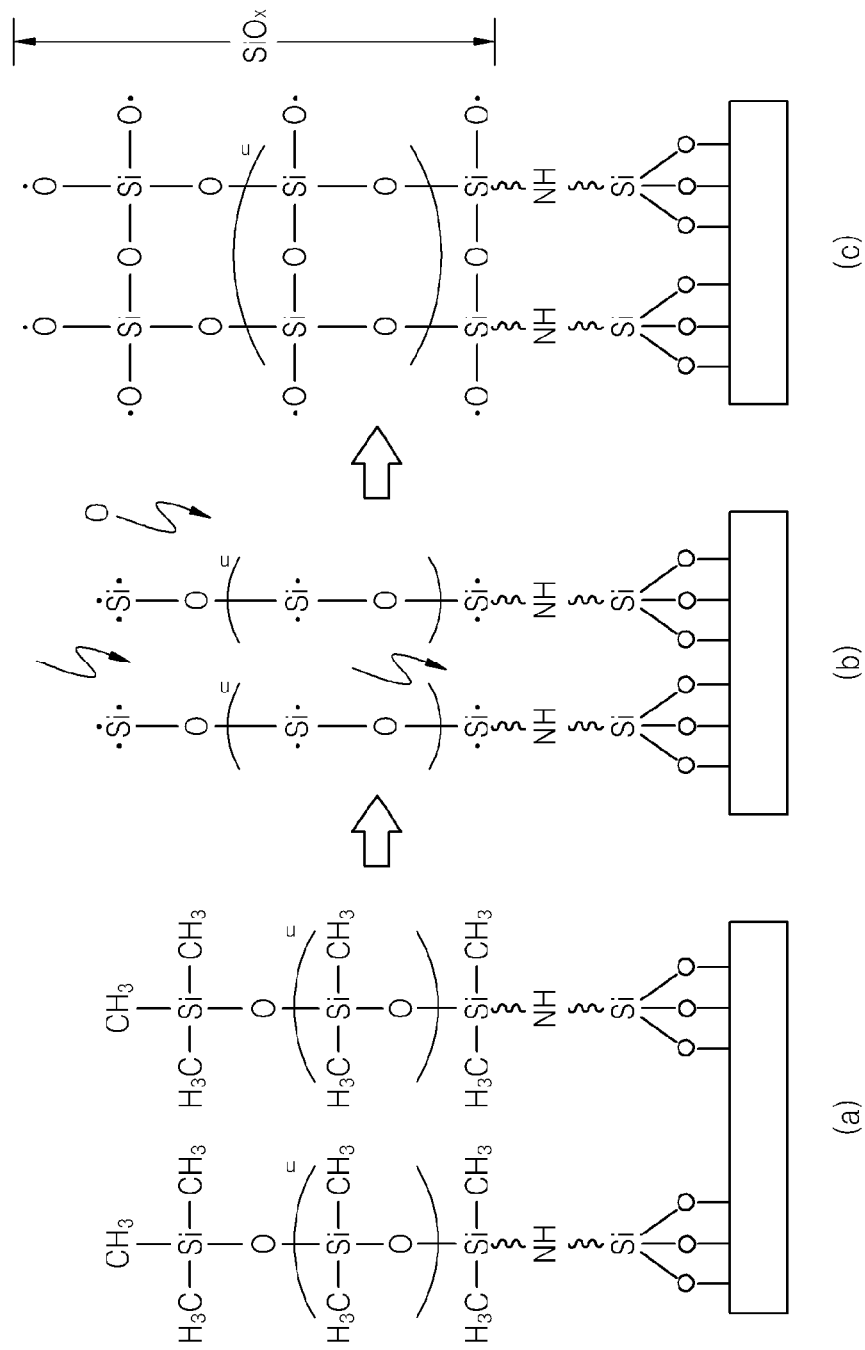
FIG. 2 is a conceptual diagram of forming a silicone silicon oxide layer by using a ultraviolet ozone (UVO) method.

For example, when a main body portion 132 of the reflector 130 is formed of a silicon-based polymer, the silicon oxide layer 134 may be easily formed by using an ultraviolet ozone (UVO) method. FIG. 2 is a conceptual diagram of forming the silicon oxide layer 134 by using a UVO method.

Referring to FIG. 2(a), silicone is formed on a substrate or another silicone layer. As illustrated in FIG. 2(a), silicone is a polymer that is approximately linear and includes a plurality of siloxane bonds. The silicone may be terminated, as illustrated in FIG. 2(a), with an alkyl group having a carbon number of 1 through 3, such as a methyl group, or with a phenyl group.

When a terminal of silicone is terminated with a phenyl group, strength and hardness of the silicone are stronger than strength and hardness of a silicone that is terminated with a methyl group, but light-extraction efficiency thereof is lower. When a terminal of silicone is terminated with a methyl group such as polydimethyl siloxane (PDMS), light-extraction efficiency thereof is excellent, but when it is used, it has excessive softness in a high temperature environment, resulting in an adverse influence on color coordinates and luminance. The silicon oxide layer 134 (see FIG. 1) may be easily formed on a surface of silicone that is terminated with a methyl group by using a UVO method which will be described below.

That is, as illustrated in FIG. 2(b), methyl groups are removed by performing a UVO method. Methyl groups that are excited by UV may react with an oxygen radical having a high activity, which comes from ozone, and may be removed by the formation of CO, $CO_2$, and water ($H_2O$). As a result, silicon atoms are placed in a chemically unstable state that, for example, unpaired electrons are present.

Furthermore, as illustrated in FIG. 2(c), silicon atoms that are in a chemically unstable state may be cross-linked with adjacent silicone chains by using oxygen which comes from ozone, as bridges, to thereby form a network structure. The cross-linked portions to form a network structure have a $SiO_x$, structure, and thus a silicon oxide layer formed of silica, similar to glass, is formed. The silicon oxide layer formed of silica, similar to glass, has more improved strength and hardness compared to silicone that is terminated with a methyl group. Furthermore, the silicone terminated with a methyl group has hydrophobicity while the silicon oxide layer formed of silica has hydrophilicity.

The above-described UVO method may be performed by using an ultraviolet ray having a wavelength of about 160 nm to about 260 nm and at a temperature of about 30° C. to about 150° C. A thickness of the silicon oxide layer 134 obtained as a result of the UVO method in the form of silica may be about 0.1 μm to about 100 μm.

While the main body portion 132 and the silicon oxide layer 134 are illustrated as separate areas in FIG. 1, the silicon oxide layer 134 may be a layer which is formed from a portion of the original main body portion 132 by surface modification of the original main body portion 132, as described above. Thus, the main body portion 132 and the silicon oxide layer 134 may be integrally formed as a single body.

Additionally, a reflection layer (not separately shown) may be further provided on a sidewall of the reflector 130 toward the light emitting device 120 in order to further increase reflectivity. For example, a single layer or a stack layer formed of a metal such as gold, silver, platinum, nickel, titanium, or aluminum, or an oxide or a nitride of these metals may be used as a reflective layer.

The light emitting device 120 may be encapsulated by an encapsulant 140. The encapsulant 140 may be formed of a material that is capable of transmitting light emitted from the light emitting device 120, to the outside. The encapsulant 140 may transmit the light emitted from the light emitting device 120, by about 70% or greater or by about 90% or greater. The encapsulant 140 may be formed of the same material as or a different material from, for example, the main body portion 132 of the reflector 130.

Also, a fluorescent material 150 that is capable of converting a wavelength of the entire or a portion of light emitted from the light emitting device 120, may be further included in the encapsulant 140. The fluorescent material 150 may be formed of, for example, an yttrium aluminum garnet (YAG)-based material, a terbium aluminum garnet (TAG)-based material, a silicate-based material, an oxide material, a sulfide material, or a nitride-based compound material.

In detail, the YAG-based and the TAG-based fluorescent materials may be selected from (Y, Tb, Lu, Sc, La, Gd, Sm)$_3$(Al, Ga, In, Si, Fe)$_5$(O, S)$_{12}$:Ce. The silicate-based fluorescent material may be selected from (Sr, Ba, Ca, Mg)$_2$SiO$_4$:(Eu, F, Cl). Also, the sulfide-based fluorescent material may be selected from (Ca, Sr)S:Eu, (Sr, Ca, Ba)(Al, Ga)$_2$S$_4$:Eu. The nitride-based fluorescent material may be at least one material selected from (Sr, Ca, Si, Al, O)N:Eu such as CaAlSiN$_4$:Eu, β-SiAlON:Eu, and (Ca$_x$M$_y$)(Si, Al)$_{12}$(O, N)$_{16}$ such as a Ca-αSiAlON:Eu-based material (where M is at least one material selected from the group consisting of Eu, Tb, Yb, and Er, and 0.05<(x+y)<0.32, 0.02<x<0.27, 0.03<y<0.30).

In detail, the fluorescent material 150 may include, as a blue fluorescent material, at least one of BaMg$_2$Al$_{16}$O$_{27}$:Eu$^{2+}$, Sr$_4$Al$_{14}$O$_{25}$:Eu$^{2+}$, BaAl$_8$O$_{13}$:Eu$^{2+}$, (Sr, Mg, Ca, Ba)$_5$(PO$_4$)$_3$Cl:Eu$^{2+}$, and Sr$_2$Si$_3$O$_8$2SrCl$_2$:Eu$^{2+}$.

Also, the fluorescent material 150 may include, as a green fluorescent material, at least one of (Ba, Sr, Ca)$_2$SiO$_4$:Eu$^{2+}$, Ba$_2$MgSi$_2$O$_7$:Eu$^{2+}$, Ba$_2$ZnSi$_2$O$_7$:Eu$^{2+}$, BaAl$_2$O$_4$:Eu$^{2+}$, SrAl$_2$O$_4$:Eu$^{2+}$, BaMgAl$_{10}$O$_{17}$:Eu$^{2+}$, and BaMg$_2$Al$_{16}$O$_{27}$:Eu$^{2+}$.

Also, the fluorescent material 150 may include, as a red fluorescent material, at least one of K$_5$Eu$_{2.5}$(WO$_4$)$_{6.25}$Sm$_{0.08}$, Y$_2$O$_3$:Eu$^{3+}$, Bi$^{3+}$, (Sr, Ca, Ba, Mg, Zn)$_2$P$_2$O$_7$:Eu$^{2+}$, Mn$^{2+}$, (Ca, Sr, Ba, Mg, Zn)$_{10}$(PO$_4$)$_6$(F, Cl, Br, OH)$_2$:Eu$^{2+}$, (Gd, Y, Lu, La)$_2$O$_3$:Eu$^{3+}$, (Gd, Y, Lu, La)BO$_3$:Eu$^{3+}$, (Gd, Y, Lu, La)(P, V)O$_4$:Eu$^{3+}$, (Ba, Sr, Ca)MgP$_2$O$_7$:Eu$^{2+}$, (Y, Lu)$_2$WO$_6$:Eu$^{3+}$, Mo$^{6+}$, (Sr, Ca, Ba, Mg, Zn)$_2$SiO$_4$:Eu$^{2+}$, (Sr, Ca)AlSiN$_3$:Eu$^{2+}$, (Ba, Sr, Ca)$_2$Si$_5$N$_8$:Eu$^{2+}$, and (Ba, Sr, Ca)$_2$SiO$_{4-x}$N$_y$:Eu$^{2+}$.

Figure 3:
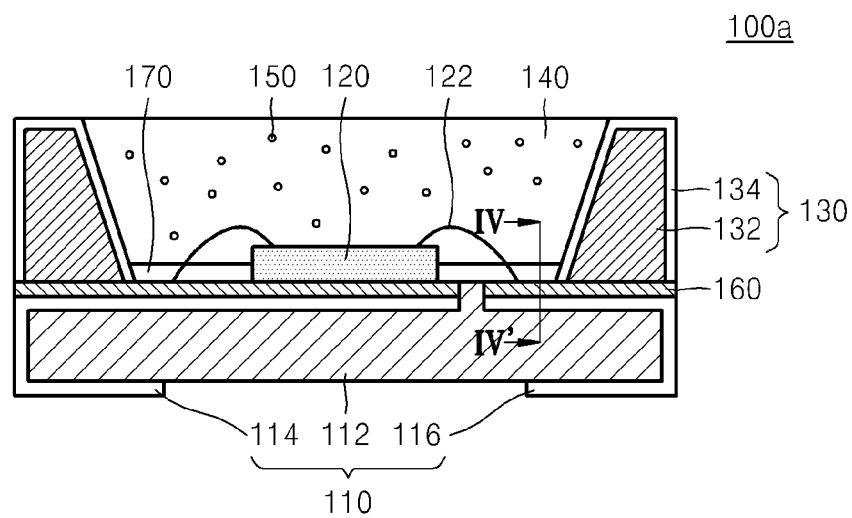
FIG. 3 is a cross-sectional view of a light emitting device package according to another embodiment of the present inventive concept.
Figure 4:
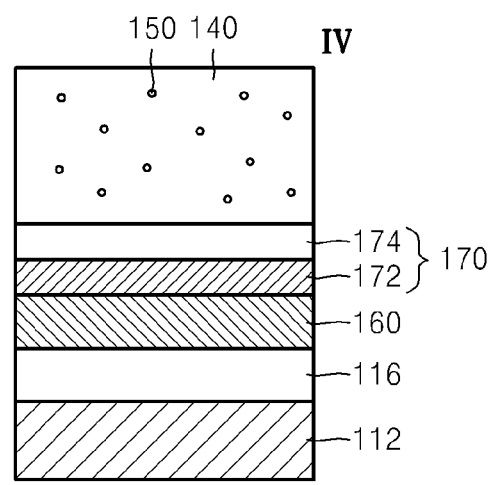
FIG. 4 is a partial and expanded cross-sectional view of a portion of the light emitting device package of FIG. 3 taken along a line IV-IV' according to an embodiment of the present inventive concept.

FIG. 3 is a cross-sectional view of a light emitting device package 100a according to another embodiment of the present inventive concept. FIG. 4 is a partial and expanded cross-sectional view of a portion of the light emitting device package 100a of FIG. 3 cut along a line IV-IV', according to an embodiment of the present inventive concept.

Referring to FIG. 3, a light emitting device 120 may be mounted on a substrate 110 and may be electrically connected to the substrate 110 via a conductive connector 122. Also, a reflector 130 may be formed to surround the light emitting device 120. A silicon oxide layer 134 may be formed on a surface of the reflector 130. Also, the light emitting device 120 may be encapsulated by using an encapsulant 140. These elements are described above in detail with reference to FIG. 1, and thus a description thereof will not be repeated here.

A reflective metal layer 160 may be formed on at least a portion of electrode wirings 114 and 116 which are a portion of the substrate 110. While the reflective metal layer 160 is formed over the entire upper surface of the electrode wirings 114 and 116 in FIG. 3, the reflective metal layer 160 may not be formed under the reflector 130. The reflective metal layer 160 may be formed of, for example, silver (Ag), but the present inventive concept is not limited thereto. The reflective metal layer 160 may be formed of a highly reflective material to thereby improve light-extraction efficiency of the light emitting device package 100a.

However, when the encapsulant 140 is formed of silicone, and if a material such as sulfur (S) may penetrate from the outside and diffuse through the encapsulant 140 to reach the reflective metal layer 160, the reflective metal layer 160 may be discolored. Discoloration of the reflective metal layer 160 decreases reflectivity, and this in turn results in reduction in light-extraction efficiency of the light emitting device package 100a.

Accordingly, in order to prevent a foreign material such as sulfur (S) from transmitting and penetrating from the outside to diffuse through the encapsulant 140, an upper portion of the reflective metal layer 160 may be covered by a protection layer 170. In detail, referring to FIG. 4, the protection layer 170 may include a silicon oxide layer 174. The silicon oxide layer 174 blocks transmission of a foreign material to the reflective metal layer 160, thereby effectively protecting the reflective metal layer 160 from discolorization.

As illustrated in FIG. 4, the protection layer 170 may further include a silicon-based polymer layer 172 such that the silicon-based polymer layer 172 is interposed between the silicon oxide layer 174 and the reflective metal layer 160.

The silicon oxide layer 174 may be formed in a manner similar to a manner in which the silicon oxide layer 134 of the reflector 130 is formed. That is, a silicon-based polymer layer may be formed on the reflective metal layer 160, and may be then processed by a UVO method, thereby forming the silicon oxide layer 174. If an originally formed silicon-based polymer layer is very thin, the entire silicon-based polymer layer may be cross-linked by oxygen, and a silicon oxide layer may be formed over the entire thickness of the silicon-based polymer layer. Alternatively, if an originally formed silicon-based polymer layer has such a thickness that the silicon-based polymer layer is not entirely converted to a silicon oxide layer by a UVO method, a silicon oxide layer 174 may be partially formed in an upper portion of the protection layer 170 as illustrated in FIG. 4, and the rest of the protection layer 170 may remain as the silicon-based polymer layer 172 (e.g., in a lower portion of the protection layer 170).

As described above, when performing a UVO method on a silicon-based polymer layer such as PDMS, a —Si—OH structure may be formed as an intermediate product in which a cross-linked bonding structure of —Si—O—Si— is to be formed. This —Si—OH structure may be easily found in portions where cross-linking structures are not yet completely formed, and thus, a hydroxyl group (—OH) may be found in the vicinity of an interface between the silicone polymer layer 172 and the silicon oxide layer 174. However, an unreacted hydroxyl group may also be present in the silicon oxide layer 174. Thus, a hydroxyl group may also be found in a central portion of the silicon oxide layer 174.

Figure 5:
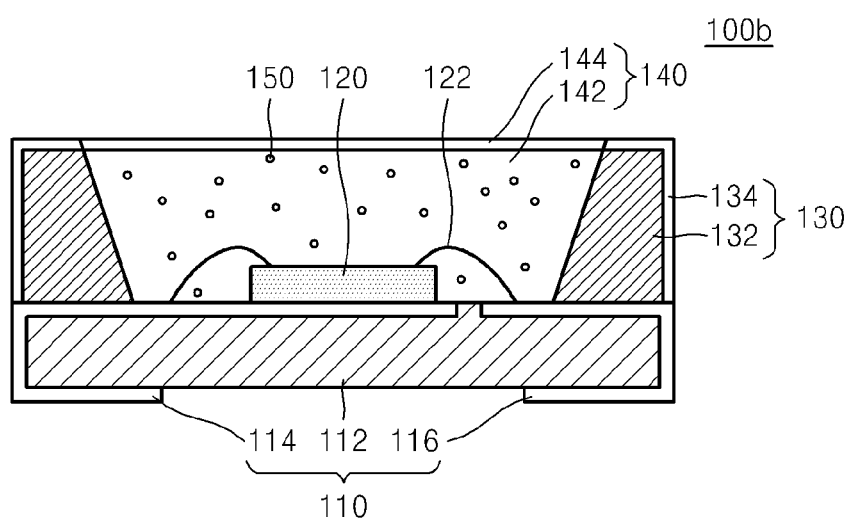
FIG. 5 is a cross-sectional view of a light emitting device package according to another embodiment of the present inventive concept.

FIG. 5 is a cross-sectional view of a light emitting device package 100b according to another embodiment of the present inventive concept.

Referring to FIG. 5, a light emitting device 120 may be mounted on a substrate 110 and may be electrically connected to the substrate 110 via a conductive connector 122. Also, a reflector 130 may be formed to surround the light emitting device 120. A silicon oxide layer 134 may be formed on a surface of the reflector 130. These elements are described above in detail with reference to FIG. 1, and thus a description thereof will not be repeated here.

The light emitting device 120 may be encapsulated by using an encapsulant 140, and a silicon oxide layer 144 may be formed on a surface of a main body portion 142. That is, as illustrated in FIG. 5, the silicon oxide layer 144 may be formed in at least a portion of the encapsulant 140 that is exposed by the substrate 110 and the reflector 130.

In FIG. 5, a thickness of the silicon oxide layer 144 formed on the surface of the encapsulant 140 and a thickness of the silicon oxide layer 134 formed on a surface of the reflector 130 are illustrated to be the same, but the thicknesses may also vary according to materials used.

The above-described operations may be separately performed or at least two operations among them may be performed in combination.

In addition, while a horizontal light emitting device is described above, the present inventive concept may also apply to a vertical light emitting device.

Hereinafter, a method of manufacturing a light emitting device package according to embodiments of the present inventive concept will be described.

FIGS. 6A through 6E are side cross-sectional views illustrating a method of manufacturing a light emitting device package 100a in an order according to an embodiment of the present inventive concept.

Figure 6A:
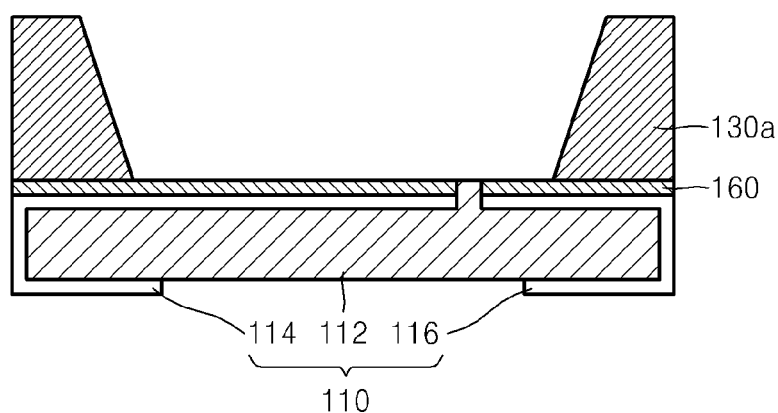
FIGS. 6A through 6E are side cross-sectional views illustrating a method of manufacturing a light emitting device package in an order according to an embodiment of the present inventive concept.

Referring to FIG. 6A, first, a substrate 110 is provided. A reflective metal layer 160 may be formed on the substrate 110. A preliminary reflector 130a, which is to be formed into a reflector, may be formed on the substrate 110 by using, for example, a transfer molding method. The preliminary reflector 130a may be formed of a silicon-based polymer such as PDMS.

While the preliminary reflector 130a is formed after forming the reflective metal layer 160 on the substrate 110 in FIG. 6A, a reflective metal layer may also be formed after first forming the preliminary reflector 130a. In this latter case, a reflective metal layer may not be present under the preliminary reflector 130a.

Figure 6B:
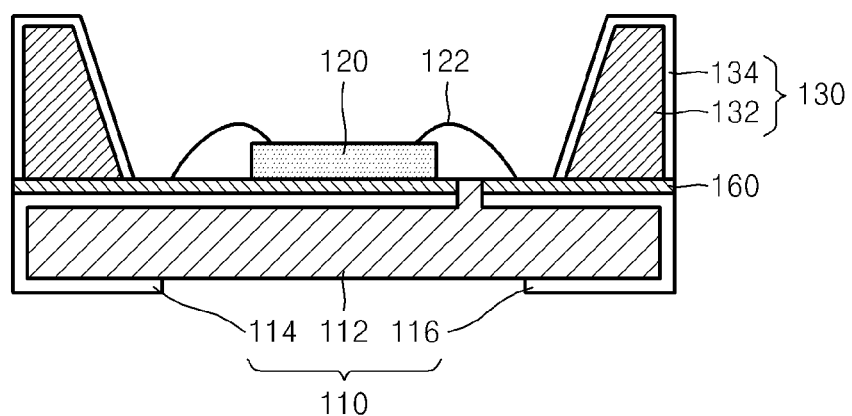

Referring to FIG. 6B, a UVO method may be performed on the preliminary reflector 130a to form a silicon oxide layer 134 on a surface of the preliminary reflector 130a, thereby obtaining a reflector 130. Also, a light emitting device 120 may be mounted on an exposed portion of the substrate 110 so as to electrically connect the light emitting device 120 with electrode wirings 114 and 116.

In this process, a UVO method may be performed on the preliminary reflector 130a after mounting the light emitting device 120, or alternatively, a UVO method may be performed on the preliminary reflector 130a first and then the light emitting device 120 may be mounted.

Figure 6C:
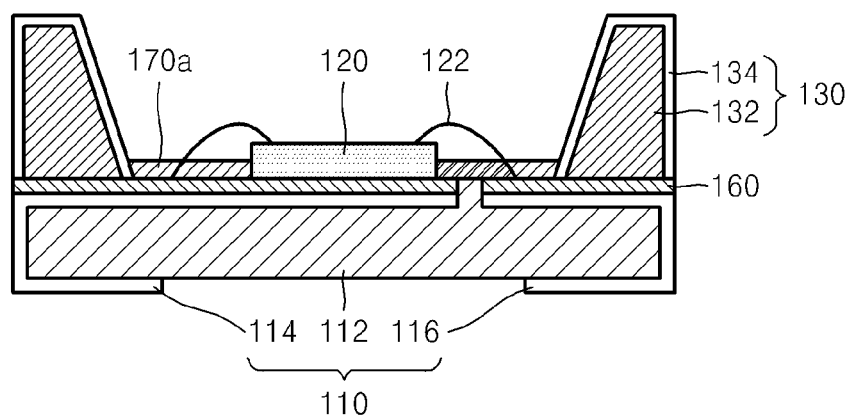

Referring to FIG. 6C, a preliminary protection layer 170a may be formed on a portion of the reflective metal layer 160 exposed through the reflector 130. The preliminary protection layer 170a may be formed of a silicon-based polymer such as PDMS. While a level of an upper surface of the preliminary protection layer 170a is lower than a level of an upper surface of the light emitting device 120, the present inventive concept is not limited thereto. A level of an upper surface of the preliminary protection layer 170a may be higher than a level of an upper surface of the light emitting device 120.

However, when a level of an upper surface of the preliminary protection layer 170a is higher than a level of an upper surface of the light emitting device 120, a fluorescent material 150, as will be described later, may have to be further included according to a degree of an increased height of the preliminary protection layer 170a.

Figure 6D:
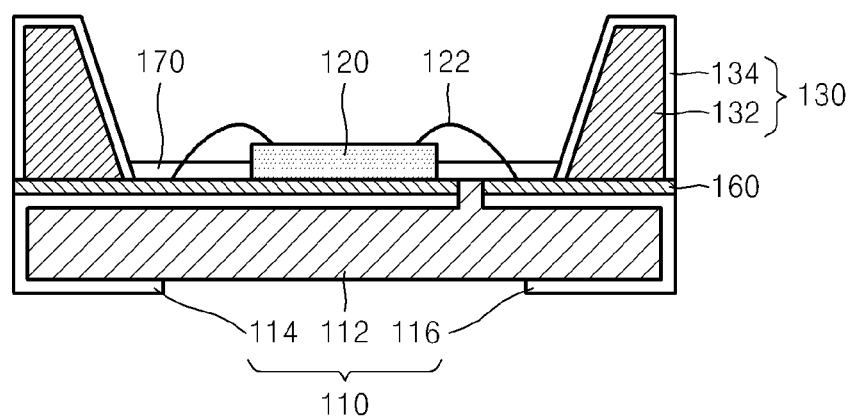

Referring to FIG. 6D, a UVO method may be performed on the preliminary protection layer 170a, thereby obtaining a protection layer 170. In this process, the UVO method may be performed under the same conditions as performed with respect to the preliminary reflector 130a before.

Selectively, a UVO method with regard to the preliminary reflector 130a described with reference to FIG. 6B may be omitted, and a UVO method may be performed on the preliminary protection layer 170a and the preliminary reflector 130a at the same time after the operation of FIG. 6C to obtain the protection layer 170.

As a result of the UVO method, as has been described above with reference to FIGS. 3 and 4, a silicon oxide layer may be formed with respect to the entire thickness of the preliminary protection layer 170a according to a thickness of the preliminary protection layer 170a and conditions of the UVO method, or a silicon oxide layer may be formed only in a portion corresponding to an upper thickness of the preliminary protection layer 170a. In either case, the reflective metal layer 160 may be protected by using a silicon oxide layer, thereby preventing a reduction in light-extraction efficiency.

Figure 6E:
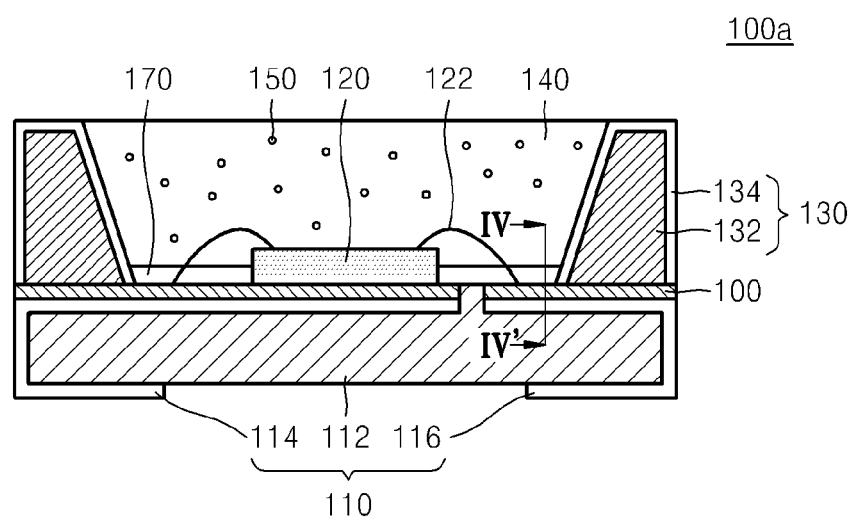

Referring to FIG. 6E, an upper space of the light emitting device 120 may be encapsulated by using the encapsulant 140 to obtain the light emitting device package 100a of FIG. 3. As described above, a fluorescent material 150 may be included in the encapsulant 140. The fluorescent material 150 has been described in detail above with reference to FIG. 1, and thus, a detailed description thereof will not be repeated here.

While not explicitly described, the method of manufacturing the light emitting device package 100 of FIG. 1 may be performed based on the method of manufacturing the light emitting device package 100a described with reference to FIGS. 6A through 6E.

Figure 7A:
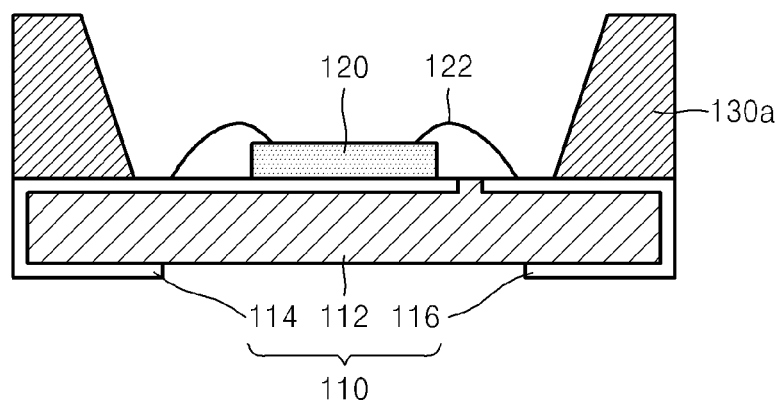
FIGS. 7A through 7C are side cross-sectional views illustrating a method of manufacturing a light emitting device package in an order according to another embodiment of the present inventive concept.
Figure 7B:
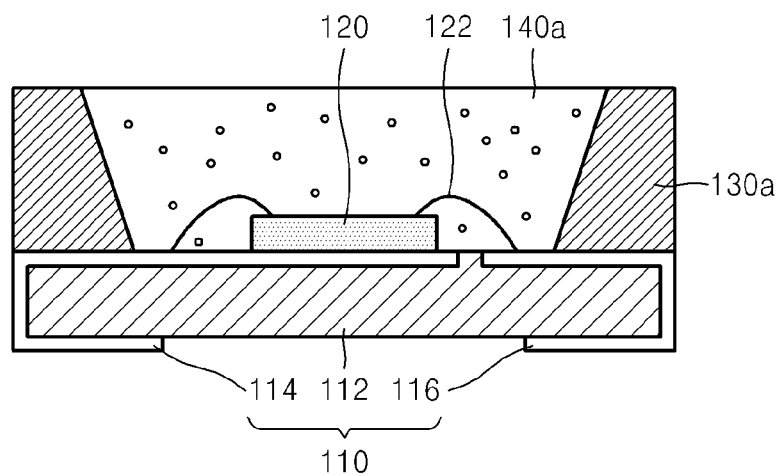
Figure 7C:
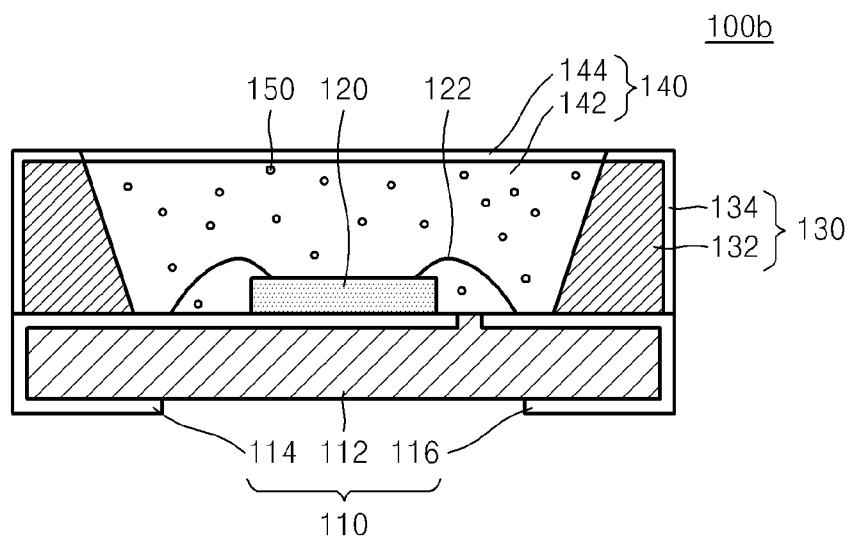

FIGS. 7A through 7C are side cross-sectional views illustrating a method of manufacturing a light emitting device package 100b in an order according to another embodiment of the present inventive concept.

Referring to FIG. 7A, a preliminary reflector 130a may be formed on a substrate 110. For example, the preliminary reflector 130a may be a silicon-based polymer having an alkyl group, such as PDMS. The process of forming the preliminary reflector 130a on the substrate 110 is described above with reference to FIG. 6A, and thus, a detailed description thereof will not be repeated here.

Then, a light emitting device 120 may be mounted on a surface of the substrate 110 that is exposed through the preliminary reflector 130a. To mount the light emitting device 120, first, a die bond paste or a silver paste may be used to attach the light emitting device 120 on the substrate 110. However, the method of attaching according to the present inventive concept is not limited thereto, and a method such as eutectic bonding may also be used. Next, the light emitting device 120 and electrode wirings 114 and 116 may be electrically connected by using a conductive connector 122.

Referring to FIG. 7B, a preliminary encapsulant 140a may be formed to encapsulate the light emitting device 120. The preliminary encapsulant 140a may be formed of the same material as, or a different material from, the preliminary reflector 130a. The preliminary encapsulant 140a may further include a fluorescent material 150.

Referring to FIG. 7C, a UVO method may be simultaneously performed on exposed surfaces of the preliminary reflector 130a and the preliminary encapsulant 140a. The conditions for the UVO method may vary according to materials of the preliminary reflector 130a and the preliminary encapsulant 140a. For example, the UVO method may be performed by using an ultraviolet ray having a wavelength of about 160 nm to about 260 nm and at a temperature of about 30° C. to about 150° C. As a result, silicon oxide layers 134 and 144 may be formed on main body portions 132 and 142, respectively.

While the silicon oxide layer 134 of the reflector 130 and the silicon oxide layer 144 of the encapsulant 140 are illustrated to have the same thickness, if different materials are used, they may have different thicknesses. As a result of the UVO method, the silicon oxide layers 134 and 144 may have a thickness of about 0.1 μm to about 100 μm.

The light emitting device package 100b of FIG. 5 may be manufactured based on the description with reference to FIGS. 7A through 7C.

Figure 8:
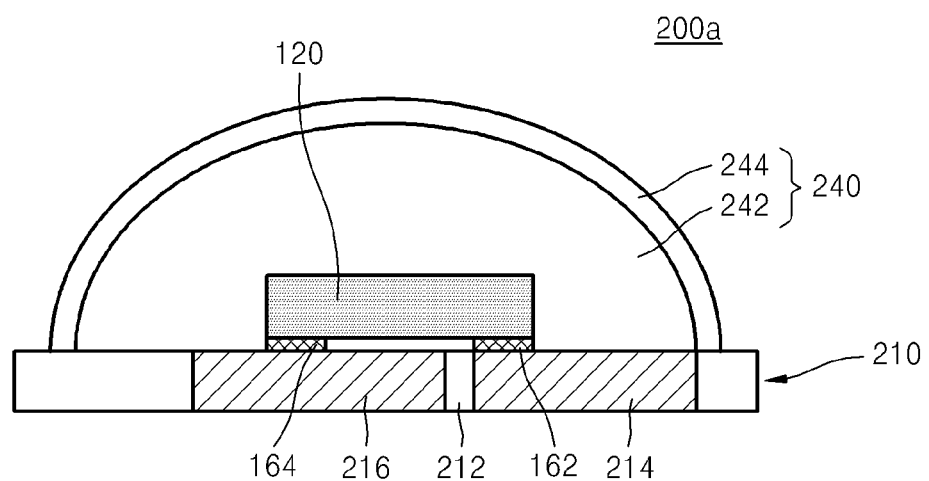
FIGS. 8 and 9 are cross-sectional views illustrating main elements of a light emitting device package according to another embodiment of the present inventive concept.
Figure 9:
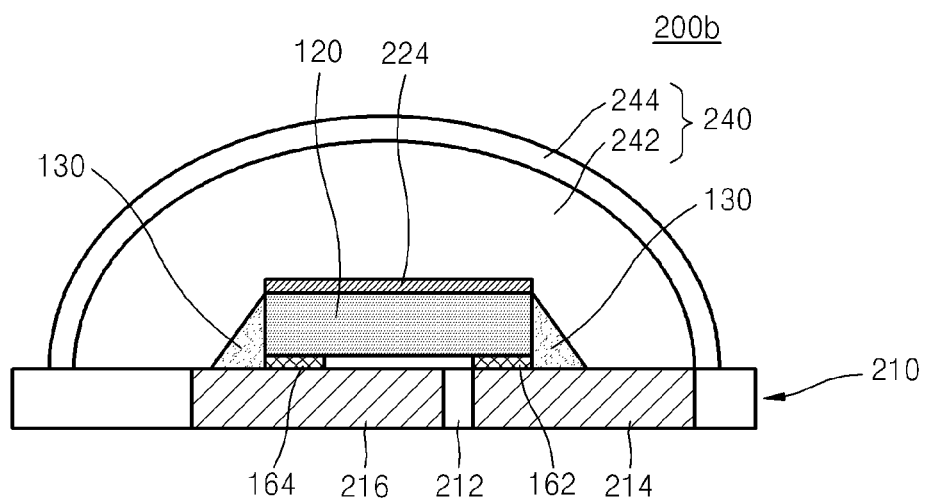

FIGS. 8 and 9 are cross-sectional views illustrating main elements of a light emitting device package 200a according to another embodiment of the present inventive concept. In FIG. 8, like reference numerals denote like elements as in FIG. 1, and here, to simplify the description, a detailed description thereof will not be repeated.

Referring to FIG. 8, the light emitting device package 200a may include a light emitting device 120 mounted on a substrate 210 via conductive connectors 162 and 164 and a lens unit 240 surrounding the light emitting device 120.

The substrate 210 may include a first conductive area 214 and a second conductive area 216 and an electrode separating unit 212 that electrically separates the first conductive area 214 and the second conductive area 216 from each other. To maximize heat radiating characteristics of the substrate 210, the first conductive area 214 and the second conductive area 216 may be each formed of a metal. For example, the first conductive area 214 and the second conductive area 216 may each be formed of at least one material selected from the group consisting of Al, Cu, Mg, Zn, Ti, Ta, Hf, Nb, Ni, Co, Fe, AN, SiC, and an alloy thereof.

The electrode separating unit 212 may be formed of an insulating material. The electrode separating unit 212 may be, for example, a polymer material such as an epoxy resin, polyphthalamide (PPA), liquid crystal polymer (LCP), polyphenylene sulfide (PPS), or polyetheretherketone (PEEK), or an insulating metal oxide layer that is obtained by performing an anodic oxidizing process on Al, Mg, Zn, Ti, Ta, Hf, or Nb. The electrode separating unit 212 may electrically separate the first conductive area 214 and the second conductive area 216 from each other, and moreover, the electrode separating unit 212 may function as a heat sink that emits heat generated in the light emitting device 120 to the outside.

According to embodiments of the present inventive concept, the lens unit 240 may be filled with a silicone polymer such as PDMS. According to another embodiment, a refracting member or a reflecting member (not separately shown) may be further included in the lens unit 240. The refracting member or the reflecting member may refract or reflect light emitted from the light emitting device 120. Also, the lens unit 240 may include a main body portion 242 and a silicon oxide layer 244 formed on a surface of the main body portion 242.

FIG. 9 is a cross-sectional view illustrating main elements of the light emitting device package 200b according to another embodiment of the present inventive concept. In FIG. 9, like reference numerals as in FIGS. 1 and 8 denote like elements, and a detailed description thereof will not be repeated for simplification of the description.

Referring to FIG. 9, the light emitting device package 200b may include a wavelength converting layer 224 covering the light emitting device 120 and a reflector 130 covering sides of the light emitting device 120.

The wavelength converting layer 224 may convert a wavelength of light emitted from the light emitting device 120 to another wavelength. While the wavelength converting layer 224 is illustrated in FIG. 9 as covering an upper surface of the light emitting device 120, the present inventive concept is not limited thereto. The wavelength converting layer 224 may be formed to cover at least a portion of a light emission surface of the light emitting device 120. The wavelength converting layer 224 may include a wavelength conversion material formed of a fluorescent substance or quantum dots. The fluorescent substance may include at least one of a yellow florescent substance, a green florescent substance, a red florescent substance, and a blue florescent substance.

The reflector 130 may be formed to cover a portion of an upper surface of the substrate 110 and a lateral surface of the light emitting device 120.

According to embodiments of the present inventive concept, the reflector 130 may include a low-refractive index resin and a light-reflecting filler dispersed in the low-refractive index resin. Light emitted from the light emitting device 120 and propagating to the reflector 130 may be reflected by the light-reflecting filler in the reflector 130. The low-refractive index resin may be an epoxy resin. The light-reflecting filler may be formed of a light-reflecting oxide such as $TiO_2$ or $SiO_2$. According to another embodiment of the present inventive concept, the reflector 130 may be formed of only a low-refractive index resin. In this case, light emitted from the light emitting device 120 may propagate to the low-refractive index resin or to the light emitting device 120 according to an incident angle of light.

Figure 10:
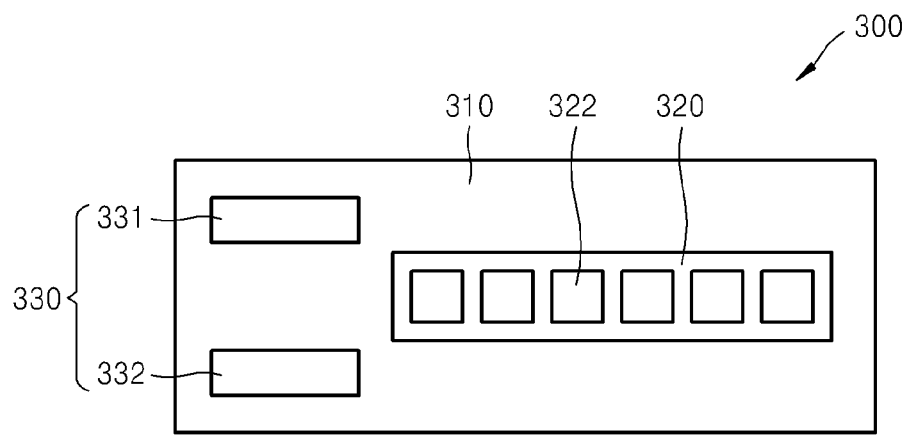
FIG. 10 illustrates a dimming system including a semiconductor light emitting device according to an embodiment of the present inventive concept.

FIG. 10 illustrates a dimming system 300 including a semiconductor light emitting device according to an embodiment of the present inventive concept.

Referring to FIG. 10, the dimming system 300 may include a light emitting module 320 and a power supply 330 disposed on a structure 310.

The light emitting module 320 may include a plurality of semiconductor light emitting devices 322. The plurality of semiconductor light emitting devices 322 may include at least one of the light emitting device packages 100, 100a, 100b, 200a, and 200b described above with reference to FIGS. 1, 3, 5, 8, and 9, respectively.

The power supply 330 may include an interface 331, through which power is input, and a power controller 332 that controls power supplied to the light emitting module 320. The interface 331 may include a fuse that blocks an overcurrent, and an electronic wave shielding filter that shields an electronic wave error signal. The power controller 332 may include a rectifier and a smoother (not separately shown) that convert an alternating current (AC) to a direct current (DC) when AC power is supplied as power, and a constant voltage controller (not separately shown) that converts the power to a voltage appropriate for the light emitting module 320. The power supply 330 may include a feedback circuit device (not separately shown) that compares an emission amount with a previously set light amount in each of the plurality of semiconductor light emitting devices 322, and a memory device (not separately shown) that stores information such as desired luminance or color rendering.

The dimming system 300 may be used as a backlight unit in a display device such as a liquid crystal display (LCD) device including an image panel, a lamp, an indoor illumination street light such as a flat panel illumination device, or an outdoor illumination device for signboards or signs. Alternatively, the dimming system 300 may be used as an illumination device for various vehicles such as an automobile, ship, or airplane, or in home appliances such as TV or refrigerator, or a medical system.

Figure 11:
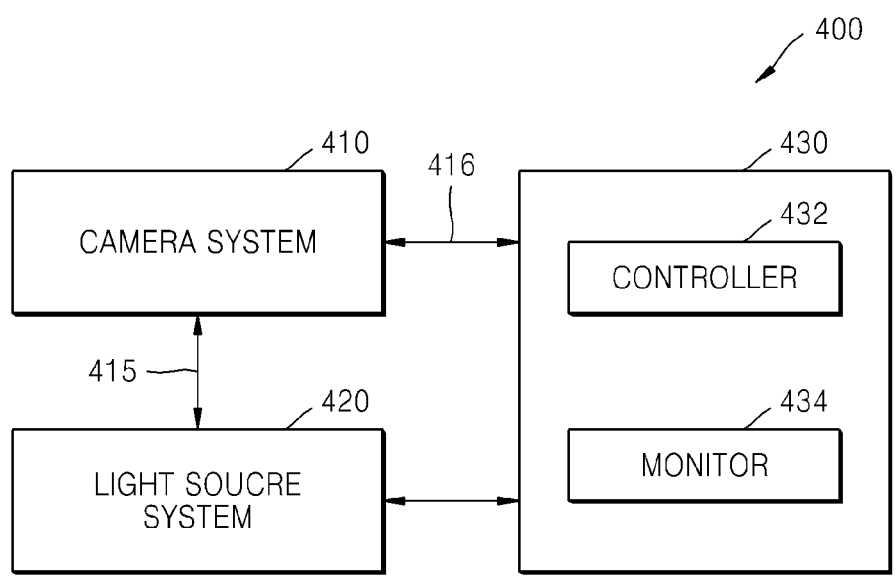
FIG. 11 is a block diagram illustrating a light processing system including a semiconductor light emitting device according to an embodiment of the present inventive concept.

FIG. 11 is a block diagram illustrating a light processing system 400 including a semiconductor light emitting device according to an embodiment of the present inventive concept.

Referring to FIG. 11, the light processing system 400 may include a camera system 410, a light source system 420, and a data processing and analysis system 430.

The camera system 410 may be in direct contact with an object that is to be optically processed or may be separated away from an object to be optically processed and to direct toward the object. According to some embodiments, the object to be optically processed may be a living tissue such as skin or a part to be treated. The camera system 410 may be connected to the light source system 420 via a light guide 415. The light guide 415 may include an optical fiber light guide that is capable of transmitting light, or a liquid light guide.

The light source system 420 provides light that is irradiated to the object to be optically processed, via the light guide 415. The light source system 420 may include at least one of the light emitting device packages 100, 100a, 100b, 200a, and 200b described above with reference to FIGS. 1, 3, 5, 8, and 9. According to embodiments of the present inventive concept, an ultraviolet ray may be generated and oscillated in the light source system 420 and irradiated to a living tissue such as skin or a part to be treated.

The camera system 410 may be connected to the data processing and analysis system 430 via a cable 416. An image signal output from the camera system 410 may be transmitted to the data processing and analysis system 430 via the cable 416. The data processing and analysis system 430 may include a controller 432 and a monitor 434. The data processing and analysis system 430 may process the image signal received from the camera system 410, and analyze and store the same.

The light processing system 400 illustrated in FIG. 11 may be applied in various application fields such as skin diagnosis, medical treatment devices, a disinfector, a sterilizer, a cleansing device, surgical equipment, cosmetic medical devices, an illumination device, or a data sensing device.

The light emitting device packages according to the embodiments of the present inventive concept have sufficient hardness, improved light-extraction efficiency, and dimensional stability, thereby facilitating stable performance.

While the present inventive concept has been particularly shown and described with reference to exemplary embodiments thereof, it will be understood that various changes in form and details may be made therein without departing from the spirit and scope of the following claims.

What is claimed is:

1. A light emitting device package, comprising:
a substrate;
a light emitting device disposed on the substrate;
a reflector surrounding the light emitting device; and
an encapsulant encapsulating the light emitting device,
wherein the reflector comprises:
a silicon-based polymer which is a main body portion;
a silicon oxide layer disposed at least on a portion of a surface of the silicon-based polymer, the silicon oxide layer and the main body portion are integrally formed as a single unit, and
a hydroxyl group (—OH) is present in the vicinity of an interface between the main body portion and the silicon oxide layer.

2. The light emitting device package of claim 1, wherein the silicon oxide layer is disposed on at least a portion of a surface of the reflector exposed to outside.

3. The light emitting device package of claim 1, wherein the silicon oxide layer is disposed at least a portion of the surface of the reflector contacting the encapsulant.

4. The light emitting device package of claim 1, wherein the silicon oxide layer has a hydrophilicity greater than a hydrophilicity of silicone.

5. The light emitting device package of claim 1, wherein the silicon oxide layer has a thickness of about 0.1 .mu.m to about 100 .mu.m.

6. The light emitting device package of claim 1, wherein: a reflective metal layer is disposed at least on a portion of the substrate exposed through the reflector, and the reflective metal layer is covered by another silicon oxide layer.

7. The light emitting device package of claim 6, wherein another silicon-based polymer is interposed between the reflective metal layer and said another silicon oxide layer.

8. The light emitting device package of claim 7, wherein a hydroxyl group (—OH) is disposed adjacent to an interface between said another silicon oxide layer and said another silicon-based polymer.

9. The light emitting device package of claim 1, wherein a particular silicon oxide layer is disposed at least on a portion of a surface of the encapsulant exposed to outside.

10. A light emitting device package, comprising:
a substrate;
a light emitting device disposed on the substrate;
a reflector surrounding the light emitting device; and
an encapsulant encapsulating the light emitting device,
wherein at least a portion of the substrate exposed through the reflector is covered by a protection layer including a silicon oxide layer and a silicon-based polymer layer,
the silicon oxide layer and the silicon-based polymer layer are integrally formed as a single unit, and
a hydroxyl group (—OH) is present in the vicinity of an interface between the silicon-based polymer layer and the silicon oxide layer.

11. The light emitting device package of claim 10, wherein: a reflective metal layer is disposed at least on a portion of the substrate exposed through the reflector, and the reflective metal layer is covered by the silicon oxide layer.

12. The light emitting device package of claim 11, wherein the reflective metal layer is silver (Ag).

13. The light emitting device package of claim 10, wherein at least a portion of a surface of the encapsulant includes another silicon oxide layer.

14. A dimming system, comprising:
a light emitting module including a plurality of light emitting device packages;
a power supply configured to supply power to the light emitting module; and
wherein each of the light emitting device packages includes:
a substrate;
a light emitting device disposed on the substrate;
a reflector surrounding the light emitting device; and
an encapsulant encapsulating the light emitting device,
wherein the reflector comprises:
a silicon-based polymer which is a main body portion; and
a silicon oxide layer disposed at least on a portion of a surface of the silicon-based polymer, the silicon oxide layer and the main body portion are integrally formed as a single unit and
a hydroxyl group (—OH) is present in the vicinity of an interface between the main body portion and the silicon oxide layer.

15. The dimming system of claim 14, wherein the power supply includes: a feedback circuit device configured to compare an emission amount with a previously set light amount in each of the plurality of semiconductor light emitting device packages; and a memory device configured to store information on desired luminance or color rendering.

16. The dimming system of claim 14, wherein the silicon oxide layer is disposed on at least a portion of a surface of the reflector exposed to outside.

17. The dimming system of claim 14, wherein the silicon oxide layer is disposed at least a portion of the surface of the reflector contacting the encapsulant.

* * * * *